United States Patent [19]
Maszara et al.

[11] Patent Number: 6,060,364
[45] Date of Patent: May 9, 2000

[54] FAST MOSFET WITH LOW-DOPED SOURCE/DRAIN

[75] Inventors: Witold P. Maszara, Morgan Hill; Srinath Krishnan, Campbell; Ming-Ren Lin, Cupertino, all of Calif.

[73] Assignee: Advanced Micro Devices, Inc., Sunnyvale, Calif.

[21] Appl. No.: 09/260,880

[22] Filed: Mar. 2, 1999

[51] Int. Cl.[7] .................................................. H01L 21/336
[52] U.S. Cl. .......................... 438/305; 438/303; 438/307; 438/532
[58] Field of Search ..................................... 438/532, 305, 438/306, 307, 229, 230, 232, 303

[56] References Cited

U.S. PATENT DOCUMENTS

| | | |
|---|---|---|
| 5,234,535 | 8/1993 | Beyer et al. . |
| 5,488,004 | 1/1996 | Yang . |
| 5,607,869 | 3/1997 | Yamazaki . |
| 5,726,081 | 3/1998 | Lin et al. . |
| 5,736,435 | 4/1998 | Venkatesan et al. . |
| 5,744,371 | 4/1998 | Kadosh et al. . |
| 5,767,549 | 6/1998 | Chen et al. . |
| 5,770,881 | 6/1998 | Pelella et al. . |
| 5,774,411 | 6/1998 | Hsieh et al. . |
| 5,811,857 | 9/1998 | Assaderaghi et al. . |
| 5,821,575 | 10/1998 | Mistry et al. . |
| 5,851,889 | 12/1998 | Michael et al. .......................... 438/301 |
| 5,882,962 | 3/1999 | Tseng et al. ............................. 438/197 |

FOREIGN PATENT DOCUMENTS 401084746  3/1989  Japan .

OTHER PUBLICATIONS

*Silicon Processing For The VLSI Era*, vol. 2: Process Integration, Chapter 2, "Isolation Technologies for Integrated Circuits", by Stanley Wolf Ph.D., pp. 66–78.

Primary Examiner—Wael Fahmy
Assistant Examiner—Long Pham
Attorney, Agent, or Firm—Amin, Eschweiler & Turocy, LLP

[57] ABSTRACT

A method (100) of forming a transistor (50, 80) includes forming a gate oxide (120) over a portion of a semiconductor material (56, 122) and forming a doped polysilicon film (124) having a dopant concentration over the gate oxide (122). Subsequently, the doped polysilicon film (124) is etched to form a gate electrode (52) overlying a channel region (58) in the semiconductor material (56, 122), wherein the gate electrode (52) separates the semiconductor material into a first region (60) and a second region (68) having the channel region (58) therebetween. The method (100) further includes forming a drain extension region (64) in the first region (60) and a source extension region (72) in the second region (68), and forming a drain region (62) in the first region (60) and a source region (70) in the second region (68). The source/drain formation is such that the drain and source regions (62, 70) have a dopant concentration which is less than the polysilicon film (124) doping concentration. The lower doping concentration in the source/drain regions (62, 70) lowers the junction capacitance and provides improved control of floating body effects when employed in SOI type processes.

17 Claims, 4 Drawing Sheets

FAST MOSFET WITH LOW-DOPED SOURCE/DRAIN

FIELD OF THE INVENTION

The present invention generally relates to semiconductor processing. More particularly, the present invention relates to a method of forming a transistor structure either in bulk material or as a SOI device, wherein the transistor exhibits a reduced junction capacitance over prior art device structures.

BACKGROUND OF THE INVENTION

MOS type transistors are a fundamental building block within integrated circuits. Consequently, there is a persistent push to make such devices smaller, faster, etc. The switching speed of a transistor is obviously an important characteristic since it dictates, at least in one respect, how fast the circuits which employ such devices operate. Presently, the switching speed of a transistor is not Limited by the channel transit time (i.e., the time required for charge to be transported across the channel); instead, the switching speed is limited by the time required to charge and discharge the capacitances that exist between the device electrodes and between the interconnecting conductive lines and the substrate.

One way of appreciating the transistor capacitances is through an exemplary cross section, as illustrated in prior art FIG. 1. The transistor, designated at reference numeral 10, includes a p-type region 12 (sometimes referred to as the body), such as a P-well in a CMOS type process. The body 12 has an n-type drain region 14 formed therein and a lightly doped drain extension region 16. Likewise, a source region 18 and a lightly doped source extension region 20 is formed in the body 12. As is well known in the art, the extension regions 16 and 20 are used to help overcome short channel transistor effects as device dimensions continue to shrink. A doped polysilicon gate 22 overlies a thin gate oxide 24 which defines a channel region 26 therebeneath in the body 12.

An effective circuit diagram illustrating the various transistor capacitances is illustrated in prior art FIG. 2. As seen in prior art FIG. 2, capacitances exist between the various device electrodes and between the electrodes and the body region. The drain-to-body capacitance ($C_{db}$) and the source-to-body capacitance ($C_{sb}$) are illustrated in both prior art FIGS. 1 and 2 and are referred to often as junction capacitances. The value of the junction capacitances are a function of both the cross sectional area of the junctions as well as the doping concentrations of the regions, respectively.

One attempt to increase the performance of the transistor 10 of prior art FIG. 1 reduces the junction capacitances by forming the transistor on an insulating region. Such a transistor device structure is called a silicon-on-insulator (SOI) device and is illustrated in prior art FIG. 3. The SOI transistor, designated at reference numeral 30, has components similar to the transistor 10 of prior art FIG. 1. In the SOI transistor 30, however, the body 12 is not formed in the bulk semiconductor material 12 as in FIG. 1, but rather overlies an insulating layer 32 such as silicon dioxide ($SiO_2$). The insulating layer 32, in turn, overlies a bulk semiconductor material 34.

The SOI transistor 30 provides several performance advantages over traditional bulk transistor devices. Initially, since each device can be completely isolated from one another (as opposed to sharing a common body), better individual device isolation is achieved, which prevents circuit latch-up conditions. In addition, since at least a portion of the drain region 14 and the source region 18 abut the insulating layer 34, the cross sectional area of the source/body and drain/body interfaces is reduced and thus the junction capacitance is significantly reduced.

Although SOI devices provide several advantages over prior art bulk type devices, SOI transistor also have several disadvantages. One disadvantage of SOI transistors could be (depending upon the application) the lack of bulk silicon or body contact to the transistor. In some cases it is desirable to connect the SOI body region 12 to a fixed potential in order to avoid "floating body effects." Use of a body contact for each transistor device, however, undesirably increases the device size and thus is not an amenable solution.

The floating body effects refer generally to various hysteresis effects which are associated with the body 12 being allowed to float relative to ground. Two such floating body effects include the "kink" effect and the parasitic lateral bipolar effect. The "kink" effect originates from impact ionization. When the SOI transistor 30 is operated at a relatively high drain-to-source voltage, channel electrons having sufficient kinetic energy cause an ionizing collision with the lattice, resulting in carrier multiplication near the drain end of the channel. The generated holes build up in the body 12 of the device 30, thereby raising the body potential. The increased body potential reduces the threshold voltage of the transistor 30, thus increasing the transistor current, which results in a "kink" in the transistor current/voltage (I/V) curves.

The second floating body effect includes the parasitic lateral bipolar effect. As discussed above, if impact ionization generates a large number of holes, the body bias may be raised to a sufficient voltage so that the source/body p-n junction becomes forward biased. When this junction becomes forward biased, minority carriers are emitted into the body 12 which causes a parasitic lateral npn bipolar transistor to turn on. Such parasitic transistor action leads to a loss of gate control of the transistor current and is therefore highly undesirable.

Therefore there is a need in the art for a devices and methods of manufacture for providing transistor devices having lower junction capacitance without altering the fundamentals of the device operation.

SUMMARY OF THE INVENTION

The present invention relates to a method of forming a transistor which exhibits a reduced junction capacitance over prior art transistor structures. The resulting transistor structure may be formed either in bulk material or as a SOI device and results in faster device performance over prior art transistor structures.

According to one aspect of the present invention, transistor junction capacitance is reduced by decoupling the step of doping the polysilicon gate from the step of forming the source/drain regions. By separating these steps, the dopant concentration of the source/drain regions may be decreased without detrimentally increasing the resistivity of the polysilicon gate or causing "poly depletion."

The method includes doping a polysilicon film prior to etching the polysilicon to form the gate. Consequently, the polysilicon doping step does not substantially impact the underlying semiconductor material. Subsequently, the source/drain regions are formed in the underlying semiconductor material, using the doped polysilicon gate as a self-alignment structure. The implantation dose used to form the source/drain regions is less than the dose used to dope the polysilicon and thus results in source/drain regions having dopant concentrations which are less than prior art source/drain dopant concentrations. The decreased dopant concentration in the source/drain regions result in decreased junction capacitance therein and thus provide improved transistor performance.

The method of the present invention may be employed in either bulk devices or in SOI type devices. In SOI devices, the present invention further reduces the junction capacitance over prior art SOI devices as well as improves the control of floating body effects. By reducing the dopant concentration in the source/drain regions, the built-in junction potential is decreased which increases the recombination of excess carriers. Therefore the amount to which the body can float in the present invention is controlled which minimizes the negative impacts of the floating body effects.

According to another aspect of the present invention, a method includes the step of forming a gate oxide over a portion of a semiconductor material. A doped polysilicon film is then formed over the gate oxide either by depositing a doped polysilicon film or by depositing a polysilicon film and subsequently doping the polysilicon which overlies the gate oxide. The doped polysilicon film is subsequently etched to form the gate; source/drain extension regions are then formed in the semiconductor material which are self-aligned with respect to the gate. The source/drain regions are then formed with a dopant concentration which is less than the dopant concentration of the polysilicon gate, and are formed either immediately after the extension regions or after the formation of sidewall spacers. The decreased dopant concentration of the source/drain regions advantageously provides for a reduction in the junction capacitance of the device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
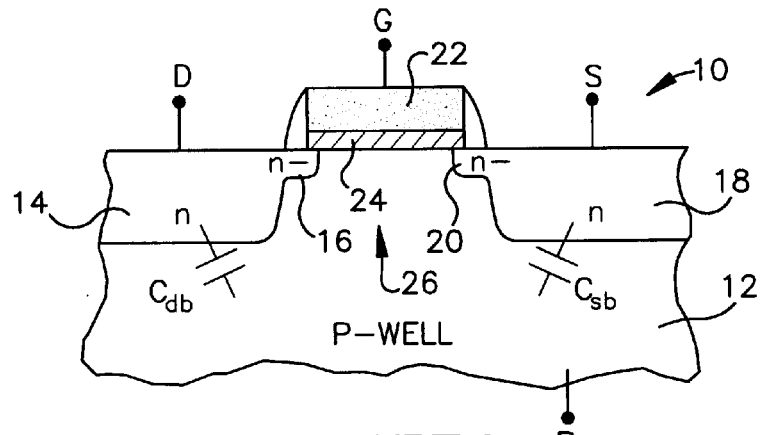
FIG. 1 is a fragmentary cross section diagram illustrating a prior art MOS type transistor structure.
Figure 2:
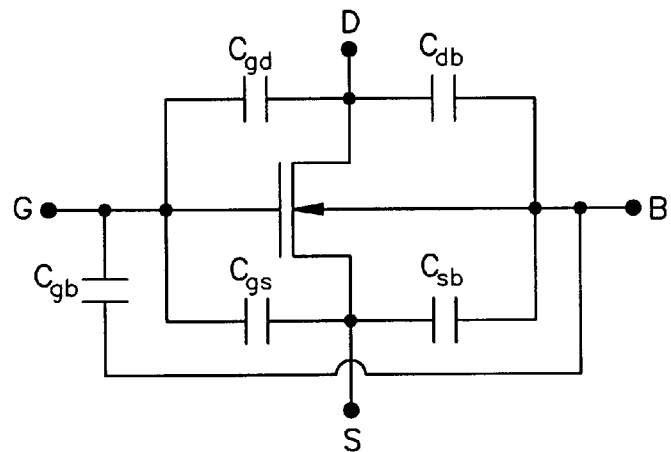
FIG. 2 is a circuit diagram illustrating the effective capacitances in the MOS transistor structure of prior art FIG. 1.
Figure 3:
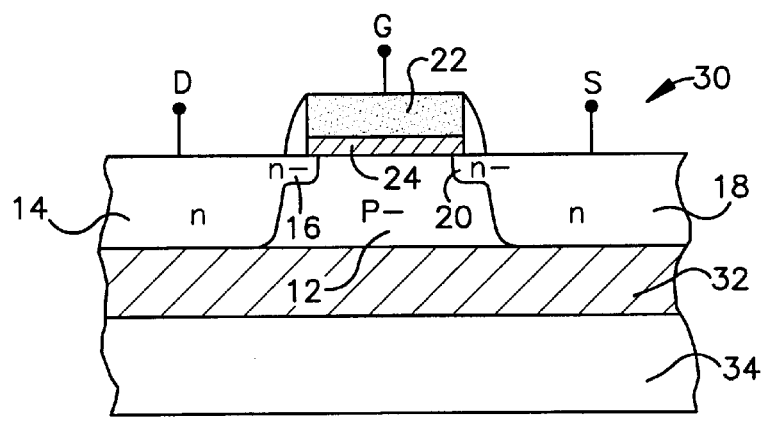
FIG. 3 is a fragmentary cross section diagram illustration a prior art SOI MOS type transistor structure.

The following is a detailed description of the present invention made in conjunction with the attached Figures, wherein like reference numerals will refer to like elements throughout. The present invention includes a method of forming a transistor structure which provides a reduced junction capacitance and thus improved performance. The method of the present invention provides for source/drain regions which have substantially lower dopant concentrations without negatively reducing the poly gate doping. Thus lower junction capacitances are provided at the source/body and drain/body interfaces without causing increased resistivity or poly depletion in the gate.

The method of the present invention reduces junction capacitance by decoupling the doping of the poly gate from the formation of the source/drain regions. Thus the high dopant concentration of the poly gate is maintained, which eliminates the potential of poly depletion, without dictating the dopant concentration levels of the source/drain regions. Therefore the present invention allows the doping of the poly gate and the source/drain regions to be individually customized as opposed to traditional processes which dope the poly gate and the source/drain regions with a single blanket implant.

Figure 4A:
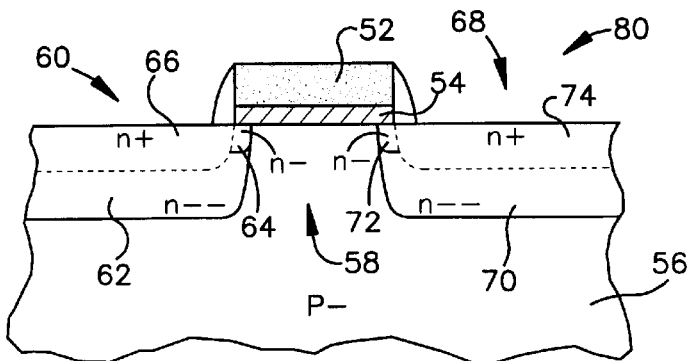
FIGS. 4a–4b are fragmentary cross section diagrams illustrating bulk and SOI MOS type transistor structures according to one aspect of the present invention.

Resultant structures produced by the method of the present invention are illustrated in FIGS. 4a, 4b, 5a and 5b, respectively. FIG. 4a illustrates a bulk MOS type transistor 50 having a doped poly gate 52 overlying a gate oxide 54. The gate oxide 54 overlies a portion 56 of semiconductor bulk material or body which defines a channel region 58. A first region 60 in the body 56 includes a drain 62, a drain extension region 64 and a drain contact region 66, respectively. Similarly, a second region 68 in the body 56 includes a source 70, a source extension region 72 and a source contact region 74.

The drain region 62 and the source region 70 are more lightly doped as compared to traditional source/drain regions. For example, conventional source/drain regions have dopant concentrations of about $10^{20}/cm^3$ which is the same as the doping concentration of the poly gate 52, since they are conventionally doped in the same implantation step. In the present invention, the doping concentrations are less than $10^{20}/cm^3$ and at least as large as the doping concentration of the body 56 in order to compensate for the channel doping. Lowering the doping concentration of the source/drain regions reduces the junction capacitances between the drain/body and source/body interfaces. The junction capacitance is related to the doping concentrations of the regions forming the junction, as can be seen from the following formula:

$$C_j = \epsilon A[(q/2\epsilon)(V_o-V)(N_a N_d/(N_a+N_d))]^{1/2}$$

wherein A represents the cross sectional area of the source/body and drain/body interfaces, $N_d$ represents the number of donors in the source and drain regions, respectively, and $N_a$ represents the number of acceptors in the body 56.

Figure 4B:
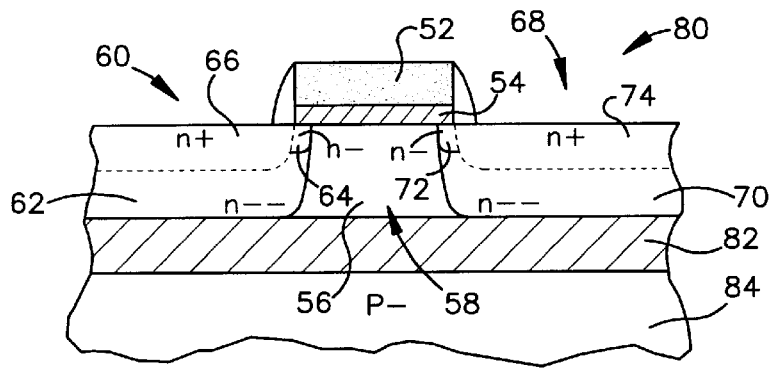

A similar transistor device is illustrated in an SOI type transistor structure in FIG. 4b, and is designated at reference numeral 80. The SOI transistor 80 is similar to the transistor 50 of FIG. 4a, except that an insulating layer 82 is formed under the drain region 62 and the source region 70. The insulating layer 82 electrically isolates the transistor 80 from an underlying semiconductor bulk region 84, which is typically fixed at a particular voltage potential. Thus the body 56 of the SOI transistor 80 is allowed to float. The SOI transistor 80 provides for a further reduction injunction capacitance over transistor 50 of FIG. 4a because the area (A) of the source/body and drain/body interfaces is reduced due to the insulating layer 82 being located underneath the drain region 62 and the source region 70, respectively.

In addition to further lowering the junction capacitance of the transistor 80, the low dopant concentration in the drain region 62 and the source region 70 result in lower built-injunction potentials ($V_o$) at the source/body and drain/body interfaces. This property can be seen from the following formula:

$$V_o=(kT/q)ln(N_aN_d/n_i^2).$$

The lower built-in junction potential in the transistor 80 provides for better control of the undesirable floating body effects because the decrease in built-in junction potential increases the recombination of excess majority carriers which are generated in the body due to impact ionization. Therefore the excess carriers can be removed faster than in prior art SOI transistors which thus cause smaller rises in body potential. Therefore the floating body effects in the present invention are less severe than in prior art SOI devices.

Figure 5A:
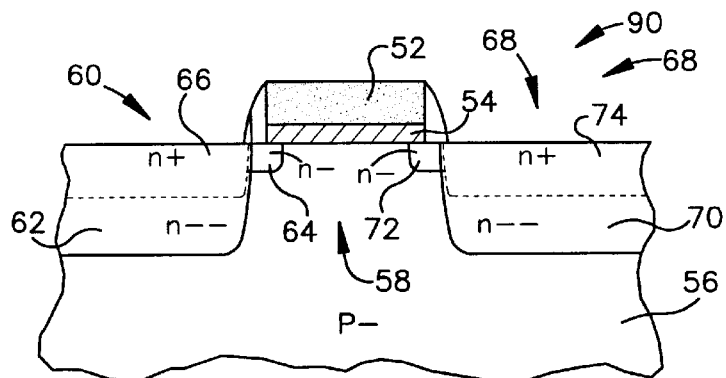
FIGS. 5a–5b are fragmentary cross section diagrams illustrating bulk and SOI MOS type transistor structures according to another aspect of the present invention.
Figure 5B:
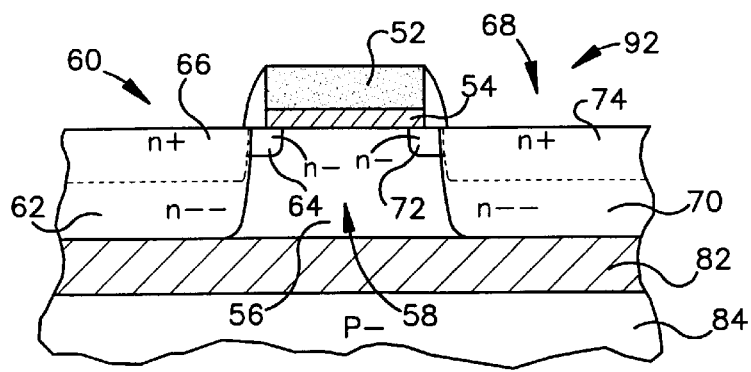

The lowering of the dopant concentration in the drain region 62 and the source region 70 also provides further flexibility in manufacturing the device. Typically, the extension regions 64 and 72 are formed using the poly gate 52 as a self-alignment structure. Subsequently, sidewall spacers are formed on each side of the gate 52 and the source/drain regions are then formed so as to increase the lateral distance between the source and drain regions under the gate. This step is performed to decrease the negative impact of short channel effects on the device. Since the source and drain regions are less heavily doped than prior art devices, their depletion regions at the source/body and drain/body interfaces are smaller, which negate the need to increase the lateral distance between the source and drain regions under the gate. Therefore the present invention allows both the extension regions and the source/drain regions to be formed prior to the sidewall spacers and thus be self-aligned to the gate, as illustrated in FIGS. 4a and 4b. Alternatively, the transistors may be fabricated with the source/drain regions formed after formation of the sidewall spacer, as illustrated in FIGS. 5a and 5b. Either method is contemplated as falling within the scope of the present invention.

The dopant concentrations in the drain region 62 and the source region 70 are less than the dopant concentration within the poly gate 52, which is typically about $10^{20}/cm^3$. Alternatively, however, any dopant concentration which is less than the poly gate doping concentration is contemplated as falling within the scope of the present invention. Because the junction capacitance of the transistor decreases as the dopant concentration in the drain 62 and the source 70, it is desirable to make the dopant concentration as low as possible. The lowest dopant concentration contemplated by the present invention is the dopant concentration which is just sufficient to compensate for the channel doping, which is typically about $3-7\times10^{17}/cm^3$. Therefore the lower bound for the source/drain doping concentration is the body dopant concentration (e.g., $3-7\times10^7/cm^3$). It is understood, however, that as device geometries continue to shrink, the body doping concentration continues to increase. Therefore any dopant concentration in the source/drain regions which is sufficient to compensate for the channel doping is contemplated as the lower bound for the doping concentration for the source/drain regions.

As the doping concentration of the source/drain regions is decreased, although the junction capacitance decreases, the resistivity of the source/drain regions increase which can cause the transistor to slow down. It is believed that between source/drain dopant concentrations of $10^7/cm^3$ and $10^{20}/cm^3$, however, that an optimal point exists where the low junction capacitance best compensates for the increased source/drain resistance. Furthermore, in addition to improving the speed performance of the device, the low doping concentrations in the source/drain regions provide better control of the floating body effect in SOI transistors, as discussed supra.

Figure 6:
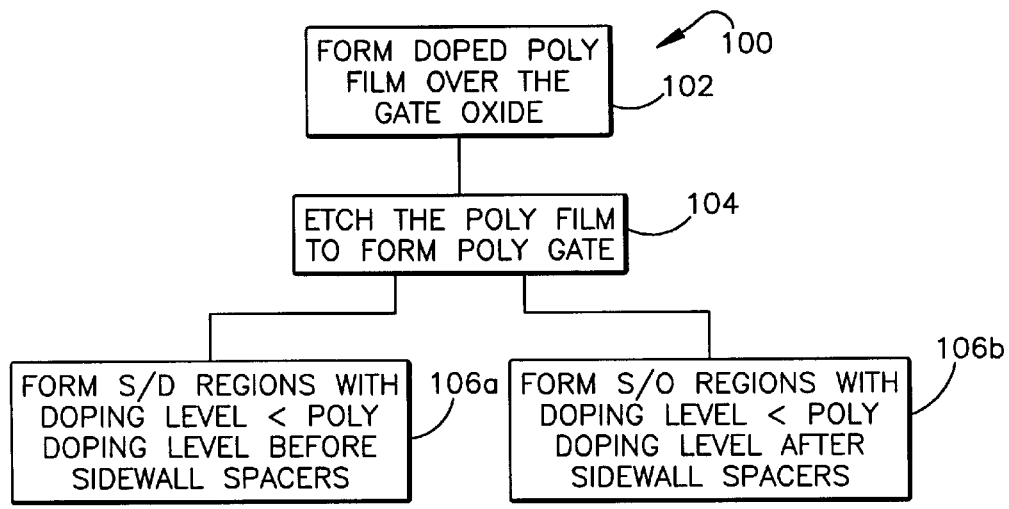
FIG. 6 is a flow chart illustrating a method of forming a transistor structure according to the present invention.

A method of forming the transistors of FIGS. 4a, 4b, 5a and 5b according to the present invention is illustrated in the flow chart of FIG. 6, as designated by reference numeral 100. The method 100 includes the step of forming a doped poly film over the gate oxide at step 102. The step 102 may include the formation of a polysilicon film followed by an implantation doping of the film or may be doped in situ during film deposition. In any event, the doping of the polysilicon film occurs separately from the formation of the various regions within the body 56. The method 100 continues at step 104, wherein the doped poly film is etched to define the poly gate 52. Lastly, the drain region 62 and the source region 70 are formed at step 106a or step 106b depending upon whether the source/drain implantation is performed before or after the sidewall spacers. Step 106a or 106b not only occurs after the doping of the poly gate 52, but also occurs at a dose and implant duration that ensures that the resultant dopant concentration is less than the dopant concentration of the poly gate 52.

Figure 7A:
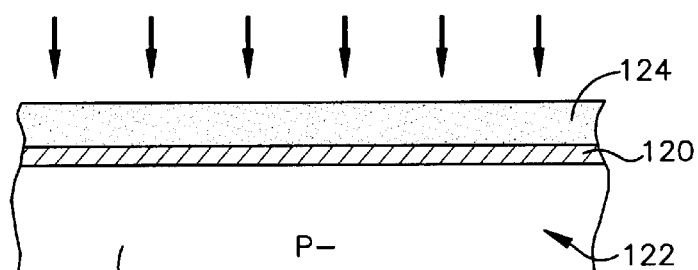
FIGS. 7a–7e are fragmentary cross section diagrams illustrating various steps of forming a bulk MOS type transistor structure according to the present invention.

Turning now to FIGS. 7a–7e, the method according to one exemplary embodiment of the present invention is provided in greater detail. As is well known by those skilled in the art, the semiconductor substrate may be subjected to various standard processing techniques to provide lateral isolation (not shown) between various devices, such as a shallow trench isolation or LOCOS process. After the isolation processing is complete, a thin gate oxide film 120 is formed over the bulk semiconductor material 122, as illustrated in FIG. 7a. Typically, the thin gate oxide film 120 is formed to have a thickness of about 40 Angstroms or less. Preferably, the thin gate oxide film 120 includes $SiO_2$ which has a substantially low dielectric constant and is grown in an oxidation furnace. Alternatively, however, it is to be appreciated that any suitable material (e.g., $Si_3N_4$) for carrying out the present invention may be employed as the gate oxide material and is contemplated as falling within the scope of the present invention.

After formation of the gate oxide film 120, the body region 56 is formed in the bulk material 122 by masking various portions of the material with a photoresist layer (not shown) and implanting p-type dopants therein to form the body 56 having a preferred dopant concentration of, for example, about $3-7\times10^{17}/cm^3$.

Subsequently, a polysilicon film 124 is formed over the gate oxide film 122 via, for example, chemical vapor deposition (CVD), although any type film formation process may be used and is contemplated as falling within the scope of the present invention. Once formed, the polysilicon film is doped via, for example, ion implantation in order to lower the resistivity of the polysilicon, as illustrated in FIG. 7a Preferably, the dopant concentration of the polysilicon is about $10^{20}/cm^3$. As is well known in the art, an anneal may be performed immediately after the doping of the polysilicon or may be performed later after other implantation steps. According to an alternative embodiment of the present invention, the doping of the polysilicon film 124 can be performed in situ while it is being deposited, thus avoiding the extra implant step.

Figure 7B:
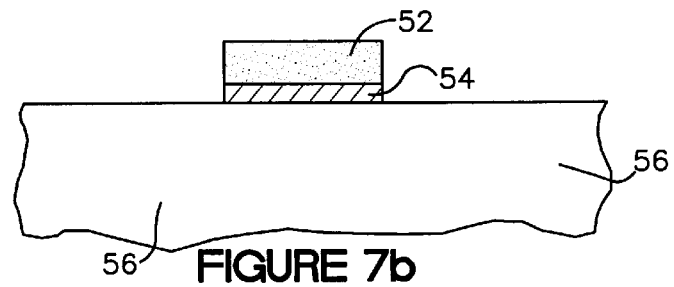
Figure 7C:
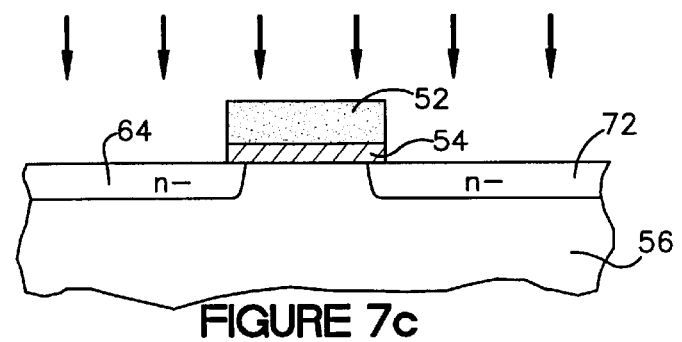

Once the polysilicon film 124 is adequately doped, the poly gate 52 and gate oxide 54 are formed via, for example, a standard dry anisotropic etch process, as illustrated in FIG. 7b. Alternatively, however, other patterning techniques may be utilized and are contemplated as falling within the scope of the present invention. After the poly gate 52 has been defined, an LDD type implant is performed to form the extension regions 64 and 72 while using the poly gate 52 to self-align the extension regions, as illustrated in FIG. 7c. Preferably, the extension regions are formed via ion implantation to form n-type regions having dopant concentrations of about $10^{18}/cm^3$. Alternatively, however, other methods of forming the extension regions 64 and 72 may be employed and are contemplated as falling within the scope of the present invention. After the formation of the extension regions, an anneal may be performed; alternatively, a single anneal may be performed later in the process after the formation of the source/drain regions.

Figure 7D:
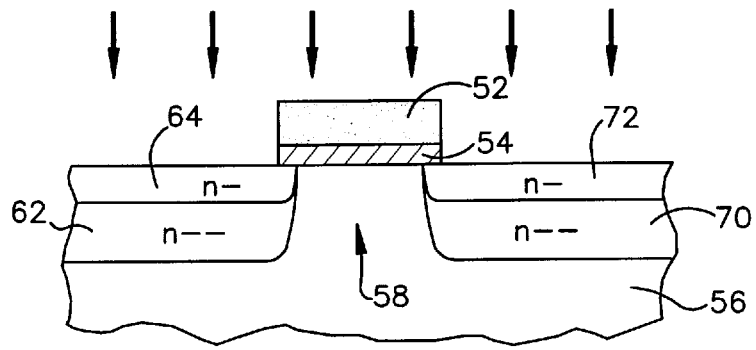

Once the extension regions 64 and 72 are formed in the body 56, a source/drain implant is performed to form the drain region 62 and the source region 70, respectively, as illustrated in FIG. 7d. The source/drain implant also uses the poly gate 52 to self-align the regions and define the channel 53 therebetween. The source/drain implant is substantially reduced with respect to conventional source/drain implants. For example, conventional source/drain implants are doped at the same time as the poly gate 52 and receive a dose of about $2-5\times10^{15}/cm^2$ to provide regions having dopant concentrations of about $10^{20}/cm^3$. The implant step of the present invention decreases the dose to be less than the poly doping implant to thereby reduce the junction capacitance formed at the source/body and drain/body interfaces as compared with the junction capacitance that would be otherwise generated in conventional processes where the poly gate and source/drain regions are doped at the same time. The source/drain implant may be decreased to various levels below the poly gate doping level, however, the implant must be at least sufficient to compensate the channel doping.

Figure 7E:
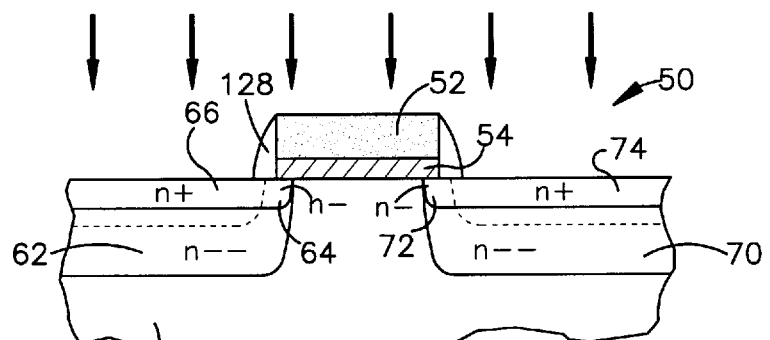

Once the source/drain regions are formed, sidewall spacers 128 are formed on the sidewalls of the doped poly gate 52. The sidewall spacers 128 are formed via, for example, a CVD oxide deposition followed by a directional etching such as, for example, reactive ion etching (RIE). Once the sidewall spacers 128 are formed, a third source/drain contact implant step is performed, which uses the sidewall spacers 128 to self-align the drain contact region 66 and the source contact region 74, respectively. Note that the sidewall spacers laterally displace the contact regions 66 and 74 with respect to extension regions and the source/drain regions, as illustrated in FIG. 7e. Please note, however, that formation of the contact regions 66 and 74 is optional since the extension regions may provide a sufficiently low contact resistivity.

FIGS. 7a–7e illustrate the steps of forming a bulk MOS type transistor 50, as illustrated in FIG. 4a. Similarly, the present invention may be employed to form an SOI device as illustrated in FIG. 4b. The formation of the insulative region 82 may be formed according to conventional techniques as is well known by those skilled in the art.

Figure 8A:
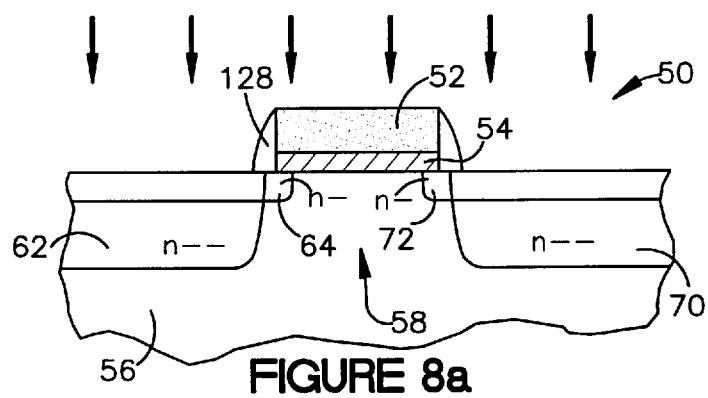
FIGS. 8a–8b are fragmentary cross section diagrams illustrating steps in forming a MOS type transistor structure according to the present invention.
Figure 8B:
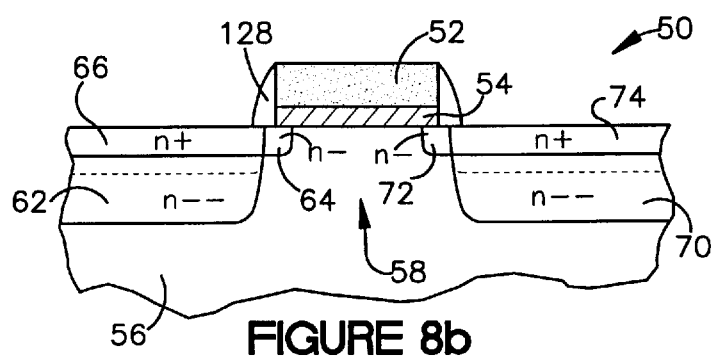

As illustrated in FIGS. 7a–7e, the present invention may form the source/drain regions prior to the formation of the sidewall spacers 128. Alternatively, the method of the present invention may be employed with the source/drain implantation step performed after formation of the sidewall spacers, as illustrated in FIGS. 8a–8b. As shown in FIG. 8a, after the LDD implant is performed to form the extension regions 64 and 72, the sidewall spacers 128 are formed. After formation of the sidewall spacers 128, the source/drain implant is performed to form the drain region 62 and source region 70, respectively. Note that since the source/drain implant is performed after the formation of the sidewall spacers 128, the channel region 58 between the drain region 62 and the source region 70 is increased by about the width of the sidewall spacers 128, as illustrated in FIG. 8a. After formation of the source/drain regions 62 and 70, a shallower, higher dopant concentration source/drain contact region implant may be performed to form the contact regions 66 and 74, as illustrated in FIG. 8b.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a transistor, comprising:

forming a gate oxide over a portion of a semiconductor material;

forming a doped polysilicon film over the gate oxide, wherein the doped polysilicon film has a first dopant concentration;

etching the doped polysilicon film to form a gate electrode overlying a channel region in the semiconductor material, wherein the gate electrode separates the semiconductor material into a first region and a second region having the channel region therebetween;

forming a drain extension region in the first region and a source extension region in the second region, wherein the drain extension region and the source extension region have a second dopant concentration; and forming a drain region in the first region and a source region in the second region, wherein the drain and source regions have a third dopant concentration which is less than the second dopant concentration of the drain extension region and the source extension region.

2. The method of claim 1, wherein the second dopant concentration is less than the first dopant concentration.

3. The method of claim 1, wherein the dopant concentration of the polysilicon film is about $10^{20}/cm^3$.

4. The method of claim 1, wherein the dopant concentration of the drain region and the source region is between about $3\times10^{17}/cm^3$ to less than about $10^{20}/cm^3$.

5. The method of claim 1, wherein the third dopant concentration of the drain region and the source region is sufficient to offset a dopant concentration of the channel region having an opposite conductivity type.

6. The method of claim 1, further comprising the steps of:

forming sidewall spacers on generally vertical sidewalls of the gate electrode after the forming of the drain region and the source region; and forming a drain contact region in the first region and a source contact region in the second region which are self-aligned with respect to the sidewall spacers.

7. The method of claim 1, further comprising forming sidewall spacers on generally vertical sidewalls of the gate electrode before the forming of the drain region and the source region, thereby causing the drain region and the source region to be self-aligned with respect to the sidewall spacers.

8. A method of forming a transistor having a reduced junction capacitance, comprising the steps of:

forming a gate oxide over a portion of a semiconductor material;

forming a polysilicon film over the gate oxide;

doping the polysilicon film to a first dopant concentration, thereby lowering a resistivity of the polysilicon film, and wherein the doping of the polysilicon film does not substantially affect a doping profile in the semiconductor material;

etching the polysilicon film after the doping of the polysilicon film, thereby forming a polysilicon gate overlying a channel region in the semiconductor material, and wherein the polysilicon gate separates the semiconductor material into a first region and a second region having the channel region therebetween;

performing an LDD implant in the first region and the second region, thereby forming a drain extension region in the first region and a source extension region in the second region, wherein the drain extension region and the source extension region have a second dopant concentration; and performing a low dose implant in the first region and the second region, respectively, thereby forming a drain region in the first region and a source region in the second region, wherein the source and drain regions have a third dopant concentration which is less than the second dopant concentration.

9. The method of claim 8, wherein the second dopant concentration is less than the first dopant concentration.

10. The method of claim 8, wherein a depth of the drain region and the source region is larger than a depth of the drain extension region and the source extension region, respectively.

11. The method of claim 8, wherein the first dopant concentration of the polysilicon film is about $10^{20}/cm^3$.

12. The method of claim 11, wherein the third dopant concentration of the drain region and the source region is between about $3\times10^{17}/cm^3$ to less than about $10^{20}/cm^3$.

13. The method of claim 8, wherein the third dopant concentration of the drain region and the source region is sufficient to offset a dopant concentration of the channel region having an opposite conductivity type.

14. The method of claim 8, further comprising the steps of:

forming sidewall spacers on generally vertical sidewalls of the gate electrode after the forming of the drain region and the source region; and forming a drain contact region in the first region and a source contact region in the second region which are self-aligned with respect to the sidewall spacers.

15. The method of claim 8, further comprising forming sidewall spacers on generally vertical sidewalls of the polysilicon gate before the forming of the drain region and the source region, thereby causing the drain region and the source region to be self-aligned with respect to the sidewall spacers.

16. A method of forming a transistor having a reduced junction capacitance, comprising the steps of:

forming a gate oxide over a portion of a semiconductor material;

forming a polysilicon film over the gate oxide;

doping the polysilicon film to a first dopant concentration, thereby lowering a resistivity of the polysilicon film, and wherein the doping of the polysilicon film does not substantially affect a doping profile in the semiconductor material;

etching the polysilicon film after the doping of the polysilicon film, thereby forming a polysilicon gate having generally vertical sidewalls overlying a channel region in the semiconductor material, and wherein the polysilicon gate separates the semiconductor material into a first region and a second region having the channel region therebetween;

performing an LDD implant in the first region and the second region, thereby forming a drain extension region in the first region and a source extension region in the second region having a second dopant concentration;

performing a low dose implant in the first region and the second region, respectively, thereby forming a drain region in the first region and a source region in the second region, wherein the source and drain regions have a third dopant concentration which is less than the second dopant concentration;

forming sidewall spacers on the generally vertical sidewalls of the polysilicon gate region after the low dose implant; and forming a drain contact region in first region and a source contact region in the second region, wherein the drain contact region and the source contact region are self-aligned with respect to the sidewall spacers.

17. The method of claim 13, wherein the second dopant concentration is less than the first dopant concentration.

* * * * *

UNITED STATES PATENT AND TRADEMARK OFFICE
CERTIFICATE OF CORRECTION

PATENT NO.: 6,060,364

DATED: May 9, 2000

INVENTOR(S): Witold P. Maszara
Srinath Krishnan
Ming-Ren Lin

It is certified that error appears in the above-identified patent and that said Letters Patent is hereby corrected as shown below:

Column 1, line 19, please replace the word "Limited" with the word --limited--.

Column 2, line 6, please add an --s-- after the word "transistor".

Column 2, line 39, please delete the word "a" after for.

Column 3, line 51, please replace the word "illustration" with the word --illustrating--.

Column 5, line 2, please put a space between the words --in junction--.

Column 5, line 10, please put a space between the words --in junction--.

Column 5 line 61, please change the equation "$3\text{-}7\times10^7/cm^3$" to --$3\text{-}7\times10^{17}/cm^3$--.

Column 6, line 5, please change the equation "$10^7/cm^3$" to --$10^{17}/cm^3$--.

Signed and Sealed this

Twenty-seventh Day of February, 2001

Attest:

NICHOLAS P. GODICI

Attesting Officer  Acting Director of the United States Patent and Trademark Office